United States Patent
Fukuta et al.

(10) Patent No.: US 11,990,311 B2
(45) Date of Patent: *May 21, 2024

(54) CHARGED PARTICLE SOURCE AND CHARGED PARTICLE BEAM DEVICE

(71) Applicant: Hitachi High-Tech Corporation, Tokyo (JP)

(72) Inventors: Masahiro Fukuta, Tokyo (JP); Kazuhiro Honda, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/130,466

(22) Filed: Apr. 4, 2023

(65) Prior Publication Data
US 2023/0238205 A1     Jul. 27, 2023

Related U.S. Application Data

(63) Continuation of application No. 17/285,365, filed as application No. PCT/JP2018/044634 on Dec. 5, 2018, now Pat. No. 11,651,929.

(51) Int. Cl.
*H01J 37/073* (2006.01)
*H01J 37/28* (2006.01)

(52) U.S. Cl.
CPC ............. *H01J 37/073* (2013.01); *H01J 37/28* (2013.01)

(58) Field of Classification Search
CPC ...... H01J 37/073; H01J 37/063; H01J 37/065; H01J 37/06; H01J 37/07; H01J 37/28; H01J 2201/30403
See application file for complete search history.

(56) References Cited

U.S. PATENT DOCUMENTS 5,834,781 A     11/1998 Fukuhara
9,633,815 B1 *   4/2017 Adamec ................ H01J 37/073
(Continued)

FOREIGN PATENT DOCUMENTS

JP     60-501581 A     9/1985
JP      4-357654 A    12/1992
JP      7-105834 A     4/1995
(Continued)

OTHER PUBLICATIONS

Shao and Khursheed, A Review Paper on "Graphene Field Emission for Electron Microscopy", Appl. Sci. May 25, 2018, p. 1-15, vol. 8, No. 868 (Year: 2018).*

(Continued)

*Primary Examiner* — David E Smith
(74) *Attorney, Agent, or Firm* — Crowell & Moring LLP (57) ABSTRACT

A charged particle source is provided that exhibits small energy dispersion for charged particle beams emitted under a high angular current density condition and allows stable acquisition of large charged particle currents even for a small light source diameter. The charged particle source has a spherical virtual cathode surface from which charged particles are emitted, and the virtual cathode surface for charged particles emitted from a first position on a tip end surface of an emitter and the virtual cathode surface for charged particles emitted from a second position on the tip end surface of the emitter match each other.

16 Claims, 11 Drawing Sheets

(56) References Cited

U.S. PATENT DOCUMENTS

| | | | |
|---|---|---|---|
| 9,697,983 B1 * | 7/2017 | Lanio | H01J 37/073 |
| 2011/0240855 A1 | 10/2011 | Ohshima et al. | |

FOREIGN PATENT DOCUMENTS

| | | | |
|---|---|---|---|
| JP | 07105834 A * | 4/1995 | |
| JP | 8-36981 A | 2/1996 | |
| JP | 9-283068 A | 10/1997 | |
| JP | 10-74446 A | 3/1998 | |
| JP | 2003-7195 A | 1/2003 | |
| JP | 2005-339922 A | 12/2005 | |
| JP | 2008-305597 A | 12/2008 | |
| JP | 2014-512069 A | 5/2014 | |
| WO | WO 85/00071 A1 | 1/1985 | |
| WO | WO 2010/070837 A1 | 6/2010 | |
| WO | WO 2012/126792 A1 | 9/2012 | |

OTHER PUBLICATIONS

International Search Report (PCT/ISA/210) issued in PCT Application No. PCT/JP2018/044634 dated Mar. 5, 2019 with English translation (five (5) pages).
Japanese-language Written Opinion (PCT/ISA/237) issued in PCT Application No. PCT/JP2018/044634 dated Mar. 5, 2019 (four (4) pages).
Japanese-language Office Action issued in Japanese Application No. 2020-558718 dated Apr. 20, 2022 (five (5) pages).
Fujita et al., "Enhanced angular current intensity from Schottky emitters", Journal of Microscopy, Wiley, Aug. 16, 2010, vol. 239, Part 3, p. 215-222 (8 pages).
Japanese-language Office Action issued in Japanese Application No. 2020-558718 dated Sep. 27, 2022 (five (5) pages).
Shao X. et al., "A Review Paper on 'Graphene Field Emission for Electron Microscopy'", Applied Sciences, May 25, 2018, pp. 1-15, vol. 8, No. 868 (15 pages).

* cited by examiner

FIG. 1A

Prior Art

CHARGED PARTICLE SOURCE AND CHARGED PARTICLE BEAM DEVICE

CROSS REFERENCE TO RELATED APPLICATIONS

This application is a Continuation of U.S. patent application Ser. No. 17/285,365, filed Apr. 14, 2021, which is a 371 of International Application No. PCT/JP2018/044634, filed Dec. 5, 2018, the disclosures of all of which are expressly incorporated by reference herein.

TECHNICAL FIELD

The present invention relates to a charged particle source that emits charged particles.

BACKGROUND ART

A charged particle source is used in a charged particle beam device such as a scanning electron microscope (SEM). The SEM is a device that performs measurement and inspection of a sample shape using an image obtained by scanning a sample with a focused electron beam. With complexity and miniaturization of a semiconductor device in recent days, especially in the SEM for semiconductor device inspection, there has been a strong demand for high resolution, improved throughput of measurement and inspection, and the like. In order to improve inspection sensitivity and length measurement capability of the SEM under a high current density condition, it is effective to narrow an energy width of particles emitted from an electron source and reduce an electron source diameter.

The following Patent Literature 1 takes "providing an electron source capable of preventing an increase in a surplus current and extraction voltage as compared with those in the related art and reducing an energy width in use with a relatively high angular current density" as a problem to be solved, and describes a technique of "an electron source provided with a supply source of an element for reducing a work function of a high-melting point metal on a needle made of a single crystal of the high-melting point metal with an axial orientation of <100>, in which an acuminate portion at a tip end of the needle has a shape including a conical portion (A), a columnar portion (B) following the conical portion (A), and a conical portion (C) following the conical portion (B) with a forefront end portion in a spherical shape, a conical angle (θ) of the conical portion (A) is 25 degrees or less; a curvature radius (r) at a spherical surface portion of a tip end of the conical portion (C) is 1.0 to 2.5 µm; and a ratio (r/L) of the curvature radius (r) of the spherical surface portion at the tip end of the conical portion (C) to a distance (L) from a boundary between the conical portion (A) and the columnar portion (B) to the tip end of the conical portion (C) is 0.1 to 0.3" (see Abstract).

The following Patent Literature 2 takes "implementing an electron emitting element and an electron gun having a high luminance and a narrow energy width, and implementing an electron microscope and an electron beam drawing device which are equipped with the electron emitting element and the electron gun and have a high luminance and a high resolution" as a problem to be solved, and discloses a technique of "considering emitting electrons from the vicinity of a five-membered ring of a closed structural region in an electron emitting element using a tubular substance having carbon as a main component, providing a large-diameter tube as necessity in order to reduce energy dispersion effect by space electron repulsion by widening an interval within the five-membered ring, and implementing a large-diameter tube structure with a stable structure by reducing dynamic distortion of a cap structure in the invention" (see Abstract).

CITATION LIST

Patent Literature

PTL 1: JP-A-2005-339922
PTL 2: JP-A-2008-305597

SUMMARY OF INVENTION

Technical Problem

Patent Literature 1 aims to reduce an energy width of particles under a high current density condition with a configuration in which an electron source including a conical portion and a columnar portion. On the other hand, as to an electron source shape, since an emitter shape is discontinuous in the vicinity of an intersection of a spherical surface portion and the columnar portion, an electric field at a position deviated from a central axis of the electron source is non-uniform. When electrons are emitted from the off-axis position, a non-uniform electric field intensity acts on the emitted electrons with aberration, and an electron source diameter increases. Since the increase in the electron source diameter leads to an increase in a beam diameter, spatial resolution decreases. In other words, although the energy width of particles from the electron source described in the same literature is narrowed, it is difficult to prevent a decrease in the inspection sensitivity and length measurement capability of an SEM, especially under a high current density condition.

Patent Literature 2 describes a method for stabilizing a tube structure in a case where a carbon nanotube is used as an electron source. However, in the same literature, an electric field in the vicinity of the electron source is not particularly considered. Therefore, according to the technique described in the same literature, it is not necessarily clear whether the inspection sensitivity and the length measurement capability of the SEM can be prevented from being reduced.

The invention has been made in view of the above problems, and an object of the invention is to provide a charged particle source in which energy dispersion of an emitted charged particle beam is small even under a high-angle current density condition and a large charged particle current can be stably obtained even with a small light source diameter.

Solution to Problem

The charged particle source according to the invention has a spherical virtual cathode surface from which charged particles are emitted, and a virtual cathode surface for charged particles emitted from a first position on a surface of an emitter tip end and a virtual cathode surface for charged particles emitted from a second position on the surface of the emitter tip end match each other.

Advantageous Effect

According to the charged particle source in the invention, electric field intensity distribution in the vicinity of an emitter tip end is uniform over a wide range. Accordingly, energy dispersion of an emitted charged particle beam is prevented to be small, and a large charged particle current can be stably obtained even with a small light source diameter.

DESCRIPTION OF EMBODIMENTS

<Charged Particle Source in Related Art>

Figure 1A:
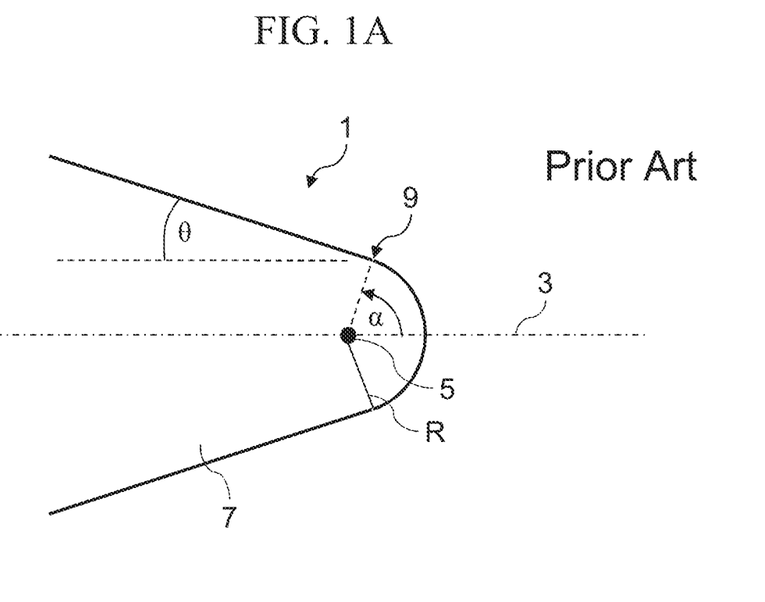
FIG. 1A is a side view showing an example of a tip end shape of a charged particle source 1 in the related art.

FIG. 1A is a side view showing an example of a tip end shape of a charged particle source 1 in the related art. The charged particle source 1 includes a tip end portion with a spherical surface shape at a tip end of an emitter needle 7. The tip end portion has a radius R with a central point S as a center. An intersection 9 between a ridge line of the emitter needle 7 and a spherical surface of the tip end portion is at a position having an elevation angle α with respect to an optical axis 3. An angle θ between the ridge line of the emitter needle 7 and the optical axis 3 may be referred to as a cone angle. When heat or a high electric field is applied to the tip end portion of the emitter needle 7, electrons are emitted in a direction of the optical axis 3.

In the charged particle source 1 in the related art, when the elevation angle α is smaller than 90 degrees, the electric field intensity distribution in the vicinity of the tip end portion is not uniform as described below. In particular, the electric field intensity distribution becomes non-uniform toward the vicinity of the intersection 9. As a result, electrons emitted from a portion away from the optical axis 3 are not on so-called paraxial trajectories and would receive off-axis aberration. Accordingly, a light source diameter of a charged particle beam increases and thus spatial resolution of the charged particle beam decreases. In order to reduce the off-axis aberration, it is necessary to reduce an acceptance angle of the charged particle beam (described later), but in this case, no large charged particle current can be obtained. A large current can be obtained even when the acceptance angle of the charged particle beam is small if an angular current density is large, but energy dispersion of an emitted charged particle beam becomes large when the angular current density is increased at the small acceptance angle.

The tip end shape as shown in FIG. 1A has the following problems: properties of emitted charged particles become unstable due to reasons such as (a) the electric field intensity distribution in the vicinity of the emitter tip end is non-uniform, and (b) the tip end shape becomes thermodynamically unstable and changes easily since a region where the tip end shape is uniform is small.

In particular, in an SEM for semiconductor inspection, high-speed scanning of electron beams is effective as a solution for improving an inspection speed. In order to obtain a high-quality image, the charged particle source is required to operate under a high-angle current density condition. However, since an energy width of the electron beams increases and the light source diameter increases under the high-angle current density condition for the above reasons, the spatial resolution of the SEM may decrease and inspection sensitivity and dimensional measurement capability may decrease.

Figure 1B:
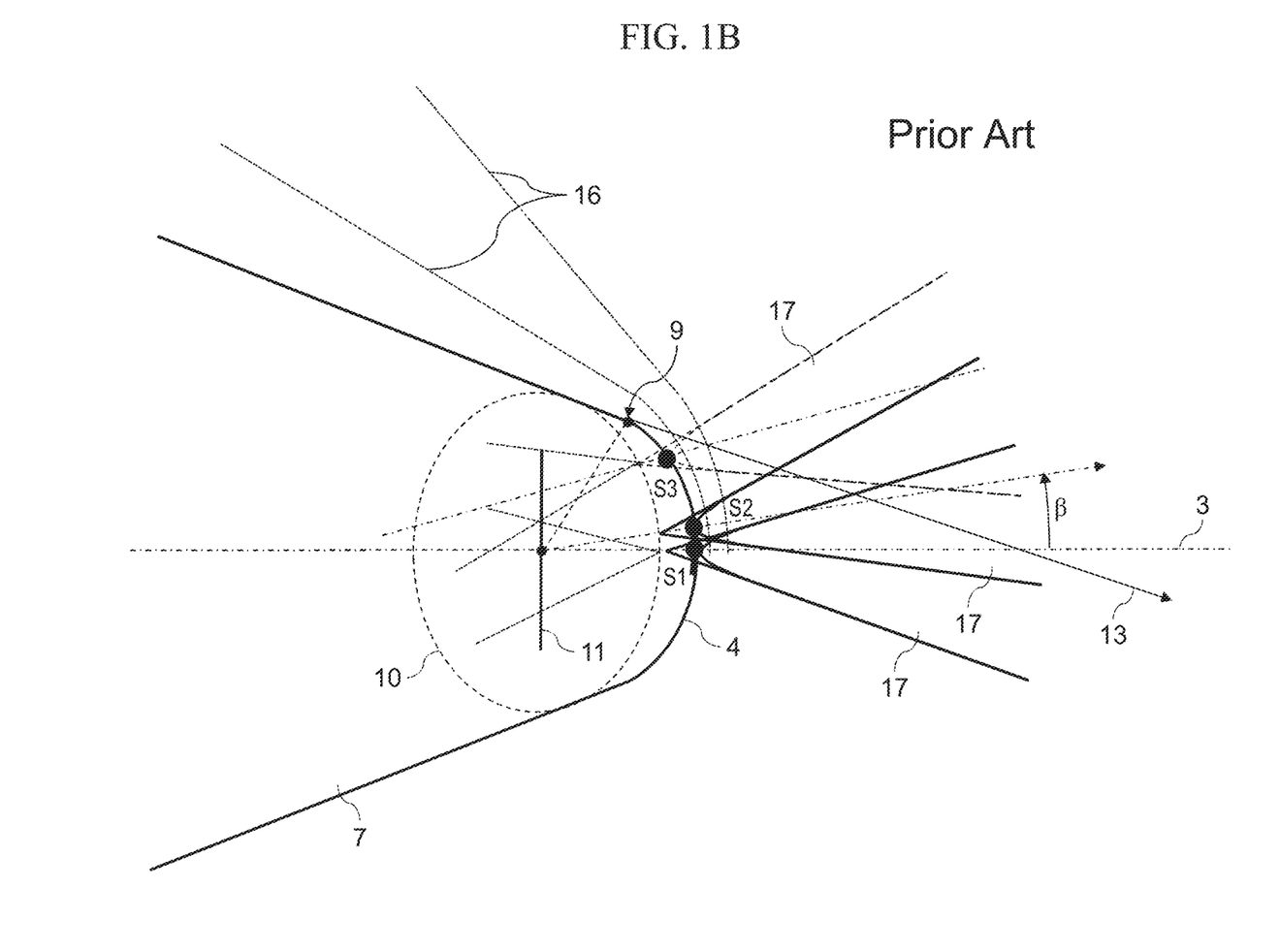
FIG. 1B is a view showing electric field intensity distribution in the vicinity of the charged particle source 1 shown in FIG. 1A.

FIG. 1B is a view showing electric field intensity distribution in the vicinity of the charged particle source 1 shown in FIG. 1A. An electric field generated by an extraction electrode (not shown) is generated in the vicinity of the tip end of the charged particle source 1. Intensity and distribution of the electric field are represented by an equivoltage surface 16. Since the elevation angle α is smaller than 90 degrees, a tangent line 13 of the spherical surface at the intersection 9 intersects with the optical axis 3. In such a shape, the electric field intensity distribution in the vicinity of the spherical surface 4 becomes non-uniform. This indicates that the equivoltage surface 16 is not parallel to the spherical surface 4 and the emitter needle 7.

FIG. 1B shows emission points S1 to S3 of charged particle beams on the spherical surface 4. The charged particle beams from the emission points have corresponding trajectories 17. Intersections of ridge lines of trajectories 17 can be regarded as positions where the charged particles are geometrically emitted. These virtual emission points constitute a virtual cathode surface 10. In the tip end shape as shown in FIG. 1B, the virtual cathode surface 10 has an elliptical surface shape extending in a direction perpendicular to the optical axis 3. Then, a distance between the emission point S1 and the virtual cathode surface 10, a distance between the emission point S2 and the virtual cathode surface 10, and a distance between the emission point S3 and the virtual cathode surface are different from each other, and thus the emission points S1 to S3 are not equivalent. Although adjacent emission points, such as the emission points S1 and S2, can be regarded as approximately equivalent, a range that can be regarded as such is fairly small. Therefore, a permissible elevation angle β that can be regarded as equivalent to properties of the charged particle beam is also small.

It is assumed that a planar virtual light source 11 is disposed at a center of the virtual cathode surface 10. Downstream of the charged particle source 1 (space between the charged particle source 1 and a sample) provided an opening plate used to narrow the charged particle beam. Although the charged particle beam is emitted from each position on the surface of the spherical surface 4, the charged particle beam with which the sample is irradiated can be narrowed by adjusting an opening and narrowing the acceptance angle. When the ridge line of the trajectory 17 of the charged particle beam to be accepted (passing through the opening plate) is extended to the virtual light source 11, both ends of the virtual light source 11 (i.e., a size of the virtual light source 11) are determined according to the acceptance angle. When the acceptance angle is increased in order to obtain a large charged particle current (e.g., the charged particle beam from the emission point S3 in FIG. 1B is accepted), the size of the virtual light source 11 becomes large. An increase in a light source size means a decrease in the spatial resolution of the charged particle beam.

Figure 2A:
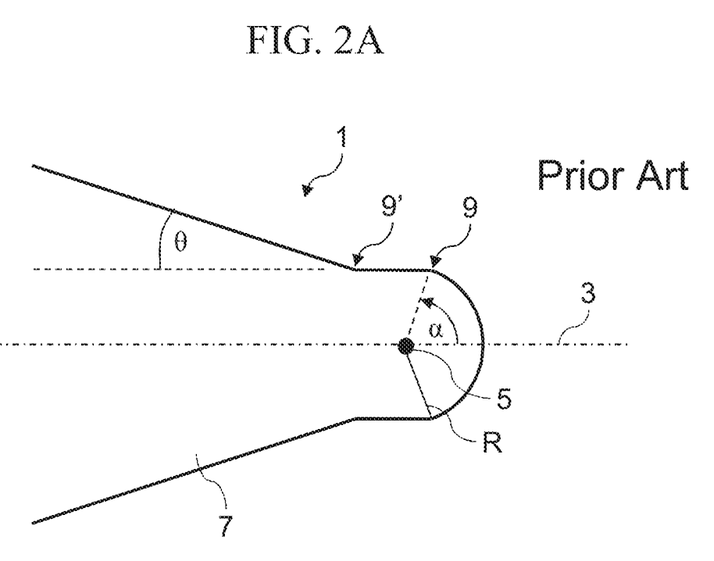
FIG. 2A is a side view showing another example of a tip end shape of the charged particle source 1 in the related art.

FIG. 2A is a side view showing another example of a tip end shape of the charged particle source 1 in the related art. In FIG. 2A, an emitter tip end portion is divided into a spherical surface portion and a flat portion (or a columnar portion). The flat portion intersects with the emitter needle 7 at an intersection 9'. The elevation angle α is the same as that in FIG. 1A. Although the charged particle source 1 of FIG. 2A is the same as that of FIG. 1A in terms of electron emission operation, the electric field intensity distribution in the periphery of the emitter tip end portion is different from that of FIG. 1A, and electron emission properties are also different from those of FIG. 1A.

Figure 2B:
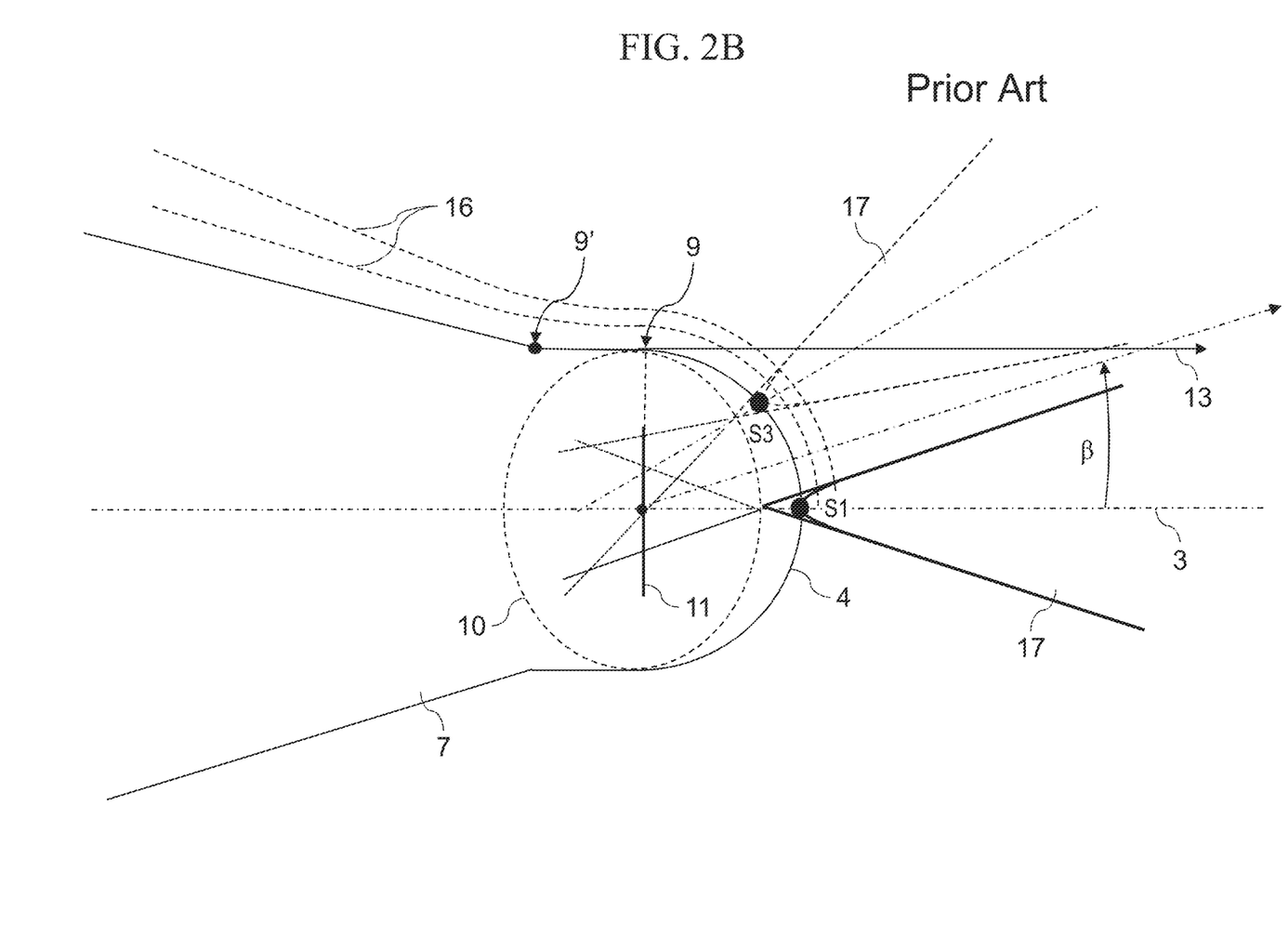
FIG. 2B is a view showing electric field intensity distribution in a case where an elevation angle α is set to 90 degrees in the shape example of FIG. 2A.

FIG. 2B is a view showing electric field intensity distribution in a case where the elevation angle α is set to 90 degrees in the shape example of FIG. 2A. When the elevation angle α is set to 90 degrees, the tangent line 13 is parallel to the optical axis 3. Even in this case, especially in the vicinity of the intersection 9', the electric field intensity distribution becomes non-uniform as shown by the equivoltage surface 16. Further, similarly to FIG. 1B, the virtual cathode surface 10 is not a spherical surface but an elliptical surface shape. Therefore, the same problem also occurs in FIG. 2B.

First Embodiment

Figure 3:
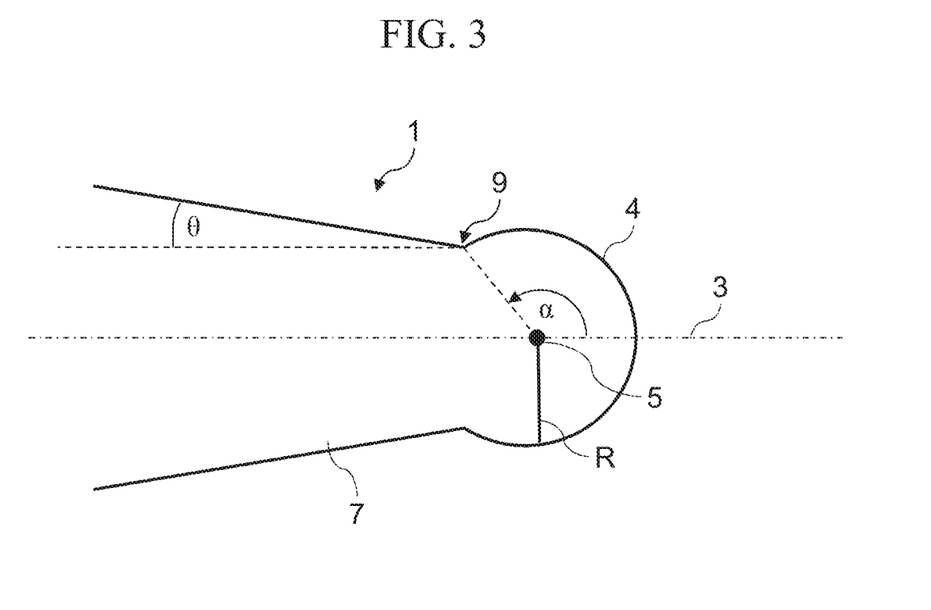
FIG. 3 is a side view showing a tip end shape of the charged particle source 1 according to a first embodiment.

FIG. 3 is a side view showing a tip end shape of the charged particle source 1 according to the first embodiment of the invention. In FIG. 3, the intersection 9 where a ridge line of the emitter needle 7 intersects with the spherical surface 4 is disposed at a position where the elevation angle α exceeds 90 degrees. Other configurations are the same as in FIG. 1A.

Figure 4:
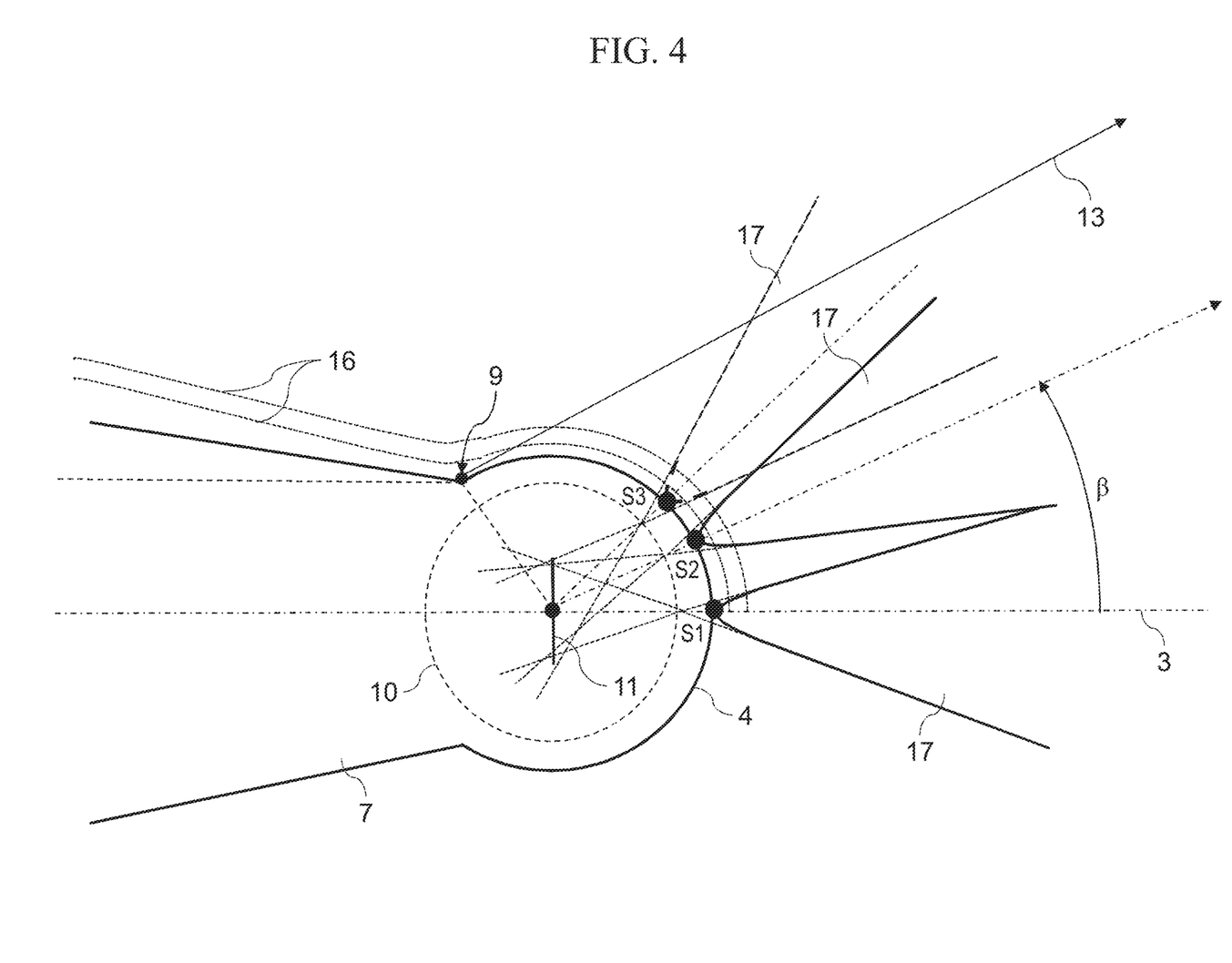
FIG. 4 is a view showing electric field intensity distribution in the vicinity of the charged particle source 1 according to the first embodiment.

FIG. 4 is a view showing electric field intensity distribution in the vicinity of the charged particle source 1 according to the first embodiment. In FIG. 4, a shape of the equivoltage surface 16 is relatively uniform even in the vicinity of the intersection 9. In other words, a region where the equivoltage surface 16 is parallel to the spherical surface 4 is wider than that in FIGS. 1B and 2B. At least in a region on a tip end side with respect to the central point 5, the equivoltage surface 16 is parallel to the spherical surface 4. Since the elevation angle α exceeds 90 degrees and the intersection 9 is disposed at a position away from the emitter tip end, it is considered that interference between an electric field in the vicinity of the spherical surface 4 and an electric field in the vicinity of the emitter needle 7 is weakened.

When a virtual cathode surface of the emission point S1 is equal to a virtual cathode surface of the emission point S2, S1 and S2 are equivalent. The same applies to S3. This condition is satisfied when electric field intensities at the emission points S1 to S3 are uniform (the equivoltage surface 16 is parallel to the spherical surface 4). Therefore, since the emission points that can be regarded as equivalent can be assured to be wider, the permissible elevation angle β can be made larger by separating the intersection 9 from the emission points S1 to S3 as much as possible (the elevation angle α may be enlarged as much as possible). In addition, a range in which the virtual cathode surface 10 can be regarded as the spherical surface becomes wider.

A range of the permissible elevation angle β can be described as follows. An angle between the tangent line 13 and the optical axis 3 is α−90 degrees. If non-uniformity of the electric field does not occur in the vicinity of the intersection 9, charged particles emitted from emission points at the angle of α−90 degrees as viewed from the central point 5 are equivalent to charged particles emitted from the emission point S1. In fact, since the electric field becomes slightly non-uniform in the vicinity of the intersection 9, an angle of an emission point equivalent to S1 is not exactly α−90 degrees. However, as the elevation angle α is larger than 90 degrees, a range of emission points that can be regarded as equivalent to S1 becomes wider, and thus the permissible elevation angle also increases.

When the permissible elevation angle β is larger, the acceptance angle of the charged particle beam can be increased. This is because the virtual cathode surface 10 has a wide range of emission points that can be regarded as the spherical surface (S1 to S3 in FIG. 4 can be regarded as equivalent). Therefore, a large charged particle current can be obtained while reducing the size of the virtual light source 11.

Figure 5:
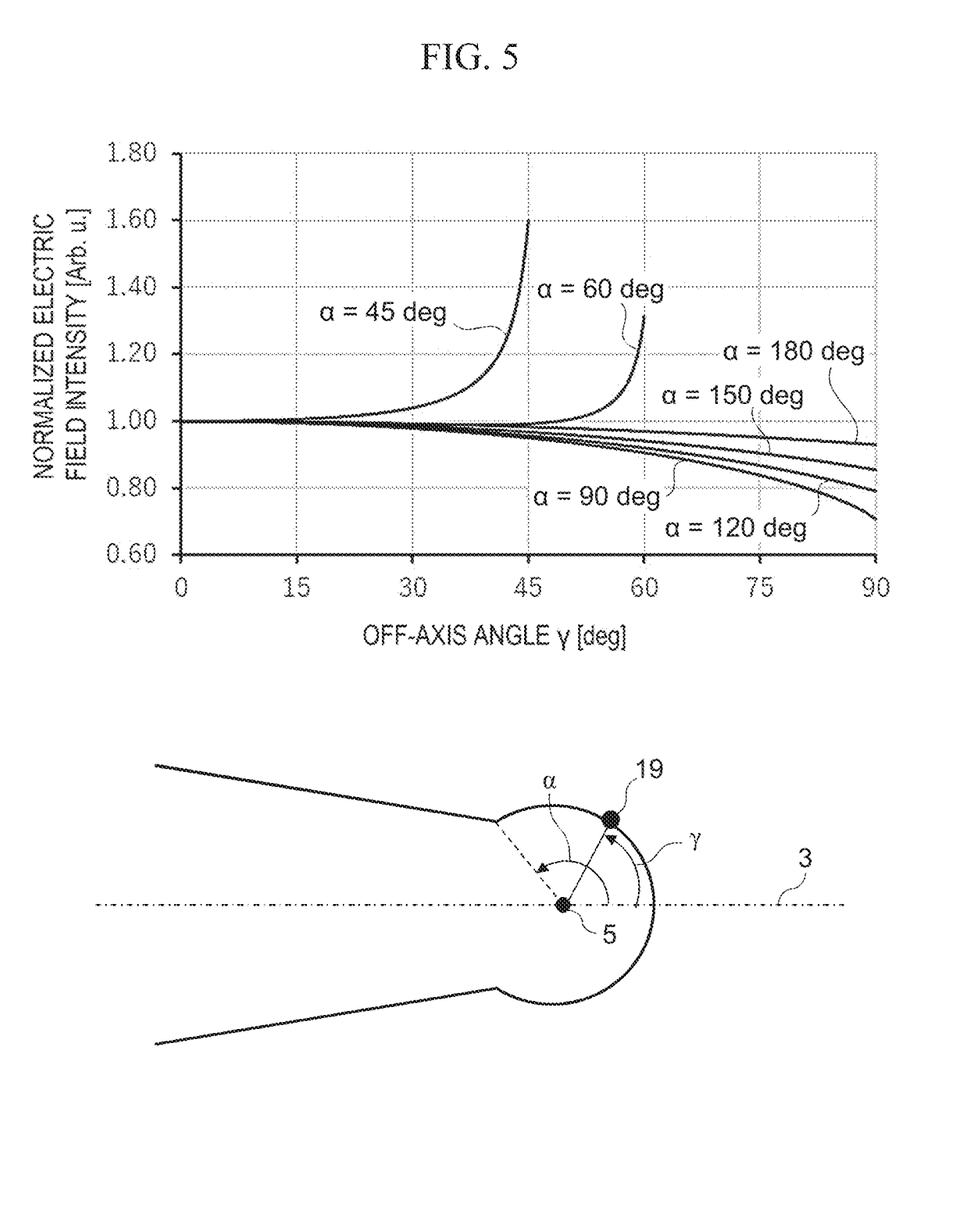
FIG. 5 shows a simulation result of electric field intensities on a surface of the charged particle source 1.

FIG. 5 shows a simulation result of electric field intensities on a surface of the charged particle source 1. It is assumed that the electric field is measured at a measurement position 19 on the spherical surface 4. An angle γ formed by the optical axis 3 and a straight line connecting the central point 5 and the measurement position 19 is referred to as an off-axis angle. In an upper part of FIG. 5, a horizontal axis represents the off-axis angle γ and a vertical axis represents a normalized electric field intensity. Situations in which α<90 degrees correspond to the charged particle sources in the related art. In this case, it can be seen that the electric field intensity rapidly increases as the off-axis angle γ increases. On the other hand, in cases where α>90 degrees corresponding to the first embodiment, the electric field intensity slightly decreases as the off-axis angle γ increases, but an amount of change is small. Therefore, it can be said that a range in which the electric field in the vicinity of the emitter tip end can be regarded as uniform is wider than that in the related art.

Overview of First Embodiment

In the charged particle source 1 according to the first embodiment, the virtual cathode surfaces 10 of the emission points S1 to S3 on the surface of the spherical surface 4 match each other. Accordingly, a range of charged particle emission points that can be regarded as equivalent can be widely assured, and thus a large charged particle current can be obtained while reducing the size of the virtual light source 11. In addition, since it is not necessary to increase the angular current density in order to obtain a large current, an energy width of the charged particle beam can be reduced.

In the charged particle source 1 according to the first embodiment, the region where the electric field intensity distribution in the vicinity of the emitter tip end is uniform is wide (as described in FIG. 5, the off-axis angle γ where the electric field on the surface of the spherical surface 4 can be regarded as the same is large), and a spherical surface region of the emitter tip end is large. Accordingly, a shape of the emitter tip end is thermodynamically stabilized. As a result, there is an advantage that properties of the charged particles emitted from the charged particle source 1 are also stabilized.

Second Embodiment

Figure 6:
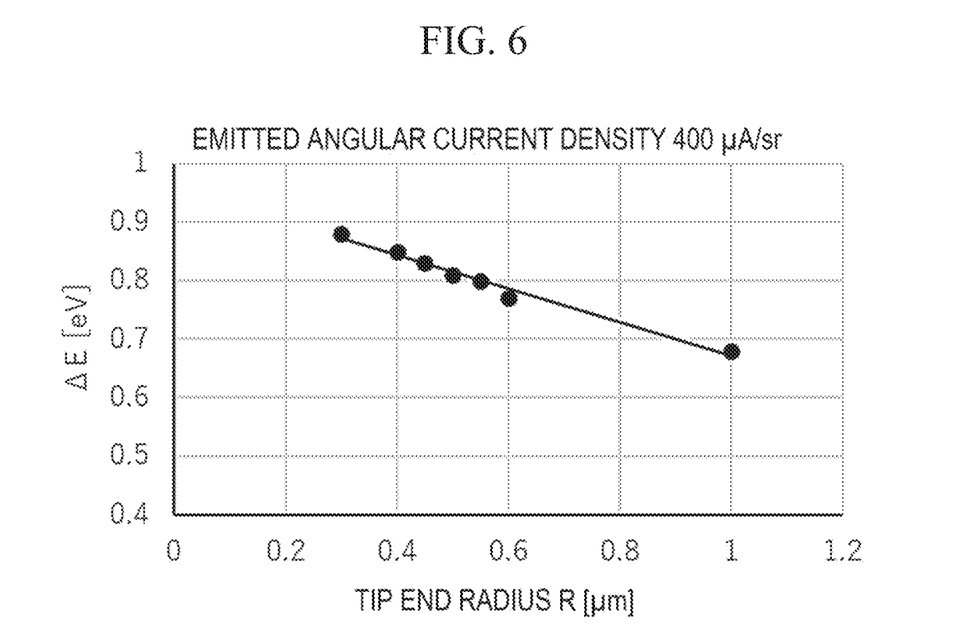
FIG. 6 is a graph showing a correspondence relationship between an energy width (4E) of electrons and a radius R of a spherical surface 4.

FIG. 6 is a graph showing a correspondence relationship between an energy width (ΔE) of electrons and a radius R of the spherical surface 4. Here, it is assumed that the charged particle source 1 emits an electron beam, and the angular current density is 400 μA/sr. A structure of the charged particle source 1 is the same as that of the first embodiment, but a suitable range of the radius R will be discussed in the second embodiment.

In the related art, in an SEM for high resolution observation, the charged particle beam is narrowed down with a small current, and thus the angular current density is small enough and is approximately 150 μA/sr or less. If a large current is obtained in order to obtain high throughput, it is necessary to increase the angular current density. However, as the angular current density increases, the energy dispersion increases. As shown in FIG. 6, ΔE decreases as the radius R increases, and thus it is desirable to increase the radius R to a certain extent.

In the SEM in the related art, when the angular current density is 150 μA/sr, the energy dispersion ΔE is controlled to be, for example, 0.6 to 0.7 eV. According to FIG. 6, it can be seen that the radius R needs to be approximately 1 μm or more in order to obtain the same level of energy dispersion ΔE as in the related art even when the angular current density is 400 μA/sr. By adjusting the radius R of the spherical surface 4 at the emitter tip end to this range, it is possible to prevent spread of the energy width even in a high angular current density.

Third Embodiment

Figure 7:
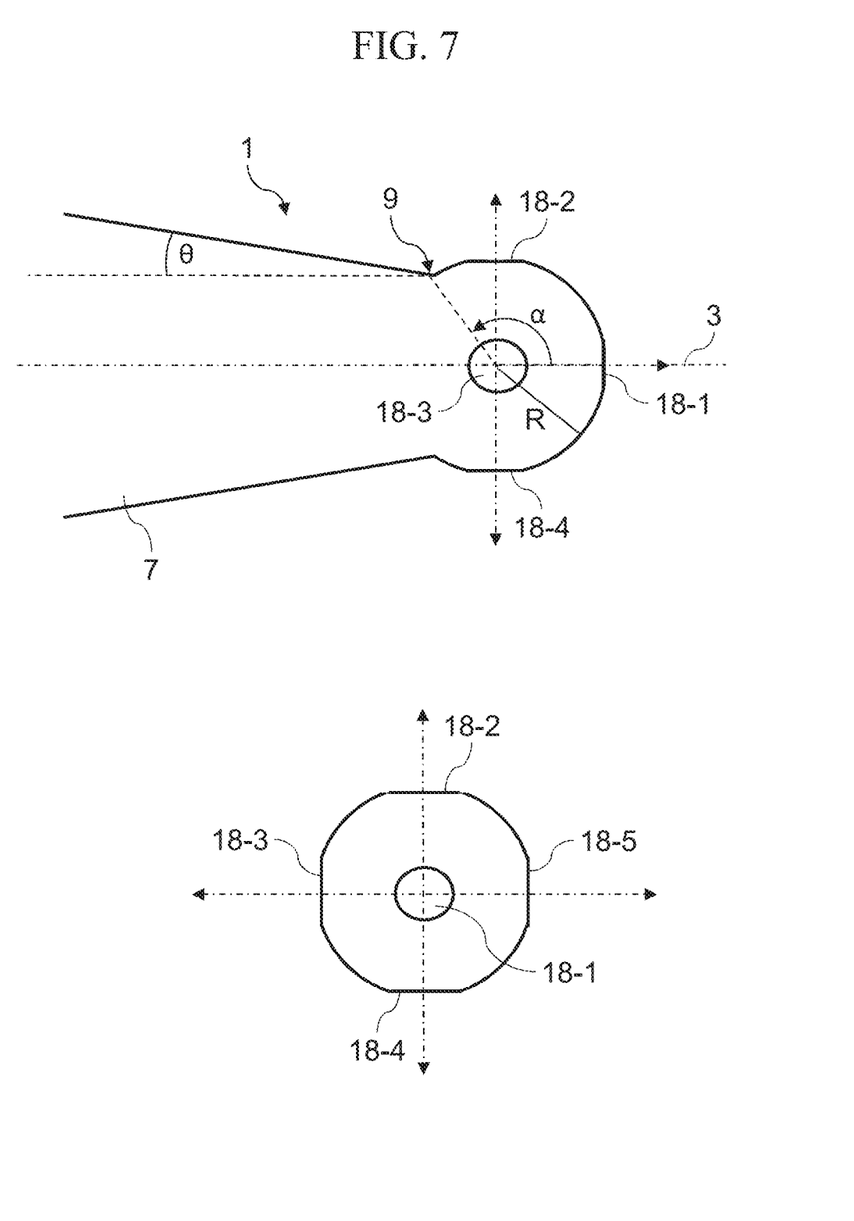
FIG. 7 is a view showing a tip end shape of the charged particle source 1 according to a third embodiment.

FIG. 7 is a view showing a tip end shape of the charged particle source 1 according to the third embodiment of the invention. An upper part of FIG. 7 is a side view, and a lower part of FIG. 7 is a front view. The charged particle source 1 according to the third embodiment has five facets (flat surfaces) on the spherical surface 4 in addition to the shape described in the first embodiment. A facet 18-1 is perpendicular to the optical axis 3. Facets 18-2 and 18-4 are perpendicular to a first straight line (upper-lower line in the lower part of FIG. 7) that is perpendicular to the optical axis 3. Facets 18-3 and 18-5 are perpendicular to a second straight line (left-right line in the lower part of FIG. 7) that is perpendicular to both the optical axis 3 and the first straight line. When the emitter needle 7 is formed of, for example, a tungsten single crystal, the direction of the optical axis 3 can be regarded as a crystallographic axis orientation of <100>.

Figure 8:
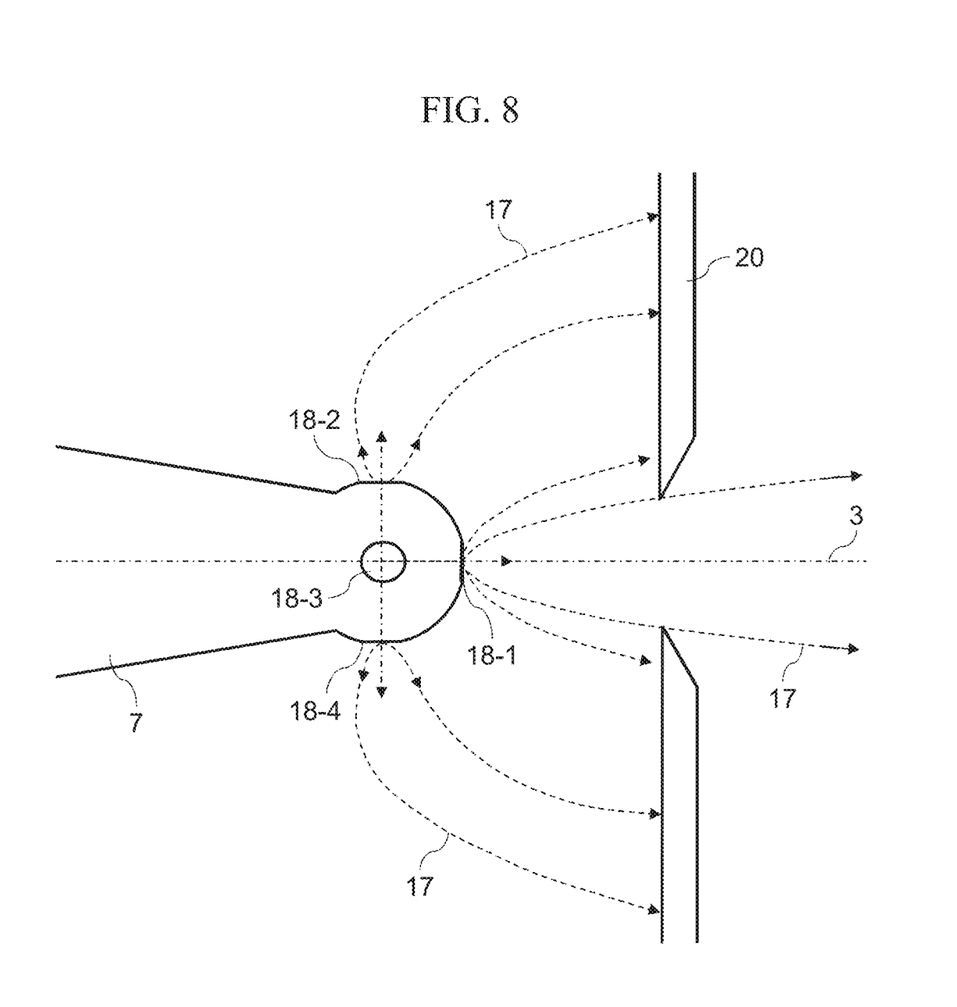
FIG. 8 is a view showing emitted charged-particle trajectories in the vicinity of an extraction electrode 20.

FIG. 8 is a view showing emitted charged-particle trajectories in the vicinity of an extraction electrode 20. When a voltage is applied to the extraction electrode 20, charged particles are emitted from each of the facets 18-1 to 18-5. The charged particles emitted from the facet 18-1 mainly pass through a hole of the extraction electrode 20 on the optical axis 3 and travel toward a sample. The charged particles emitted from the facets 18-2 to 18-5 mainly collide with the extraction electrode 20.

When the atmospheric gas or the like in the periphery of the extraction electrode 20 adheres to the extraction electrode 20, the atmospheric gas is discharged from the extraction electrode 20 when a charged particle beam device 100 is operating, and a vacuum degree in the periphery of the charged particle source 1 decreases to hinder the operation. This may affect, for example, properties of the charged particle beam. By applying the charged particles emitted from the facets 18-2 to 18-5 to the extraction electrode 20, it is possible to promote the discharge of the adhering gas. That is, the periphery of the charged particle source 1 can be quickly returned to a high vacuum state. As a result, there is an advantage that the operation of the charged particle source 1 is stabilized.

Since the facets 18-2 to 18-5 are disposed at positions away from the optical axis 3 and are oriented in a direction orthogonal to the optical axis 3, most of the charged particles emitted from the facets 18-2 to 18-5 collide with the extraction electrode 20 at positions away from the optical axis 3. Therefore, even if secondary electrons are generated from the extraction electrode 20 through charged particle collision, the secondary electrons do not pass through the hole on the optical axis 3 or be directed to a sample side. That is, it is possible to prevent background noise of an observation image caused by the secondary electrons.

Fourth Embodiment

Figure 9:
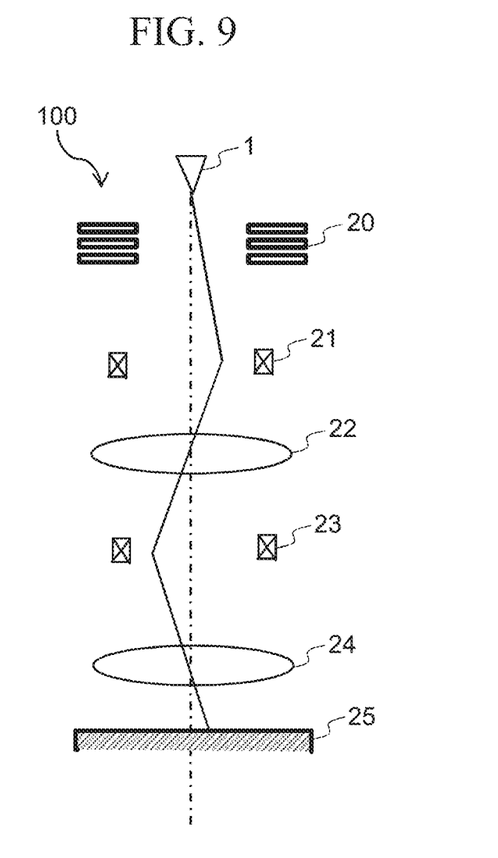
FIG. 9 is a diagram of a configuration of a charged particle beam device 100 including the charged particle source 1.

FIG. 9 is a diagram of a configuration of the charged particle beam device 100 including the charged particle source 1. The charged particle beam device 100 can be, for example, a scanning electron microscope. The charged particle source 1 has been described in any one of the first to third embodiments. A charged particle beam extracted from the charged particle source 1 by the extraction electrode 20 is focused by an objective lens 24 and emitted onto a sample 25. An intermediate lens 22 is disposed between the objective lens 24 and the extraction electrode 20. The intermediate lens 22 is used to control a current amount of the charged particle beam emitted onto the sample 25, an opening angle of the charged particle beam on the sample 25, and the like. Deflectors 21 and 23 individually deflect the charged particle beam.

The charged particle beam device 100 according to the fourth embodiment can obtain a large current while reducing the energy width of the charged particle beam due to action of the charged particle source 1. In addition, the properties of the charged particle beam are also stable.

<Modifications of Invention>

The invention is not limited to the embodiments described above and includes various modifications. For example, the above embodiments have been described in detail for easy understanding of the invention, and are not necessarily limited to those having all configurations described above. Furthermore, a part of a configuration of one embodiment can be replaced with a configuration of another embodiment, and a configuration of another embodiment can be added to a configuration of one embodiment. In addition, a part of a configuration of each embodiment can be added, deleted, or replaced with another configuration.

The charged particle source 1 according to the invention can be used as, for example, an ion source in a focused ion beam device or an electron source in a scanning electron microscope. The charged particle source 1 can be a thermal field emission electron emitting source or a cold cathode electron source.

When the cone angle θ increases, a voltage of the spherical surface 4 and a voltage of a ridge line portion of the emitter needle 7 interfere with each other in the vicinity of the intersection 9, and the electric field intensity distribution is non-uniform. Therefore, it is desirable that the cone angle θ is as small as possible. It is preferable to set approximately θ≤5 degrees. θ=0 degree (i.e., the ridge line portion of the emitter needle 7 is parallel to the optical axis 3) may be satisfied. Further, θ<0 degree (i.e., a shape in which the emitter needle 7 gradually becomes thicker toward the tip end) may be satisfied.

REFERENCE SIGN LIST

1: charged particle source
3: optical axis
4: spherical surface
5: central point
7: emitter needle
9: intersection
10: virtual cathode surface
11: virtual light source
13: tangent line
16: equivoltage surface
17: trajectory
20: extraction electrode
100: charged particle beam device

The invention claimed is:

1. A charged particle source configured to emit charged particles, the charged particle source comprising:
an emitter configured to emit charged particles from a tip end,
wherein the emitter has a shape of a spherical surface attached to a tip end of a needle portion,
wherein an angle over 90 degree is formed between a straight line and an optical axis of the charged particles, the straight line connecting an intersection between the needle portion and the spherical surface with a center of the spherical surface, and
wherein a distance between a first position on a surface of the spherical surface and the center is equal to a distance between the intersection and the center.

2. The charged particle source according to claim 1, wherein the angle is 120 degree.

3. The charged particle source according to claim 1, wherein the angle is 150 degree.

4. The charged particle source according to claim 2, wherein the needle portion has a shape that becomes gradually thicker toward a tip end of the emitter.

5. A charged particle beam apparatus comprising the charged particle source according to claim 1.

6. A charged particle source configured to emit charged particles, the charged particle source comprising:
an emitter configured to emit charged particles from a tip end,
wherein the emitter has a shape of a spherical surface attached to a tip end of a needle portion,
wherein an angle over 90 degree is formed between a straight line and an optical axis of the charged particles, the straight line connecting an intersection between the needle portion and the spherical surface with a center of the spherical surface,
wherein a distance between a first position on a surface of the spherical surface and the center is equal to a distance between the intersection and the center,
wherein the needle portion has a shape tapering toward a tip end of the emitter, and
wherein an angle between an outer side surface of the needle portion and an optical axis of the charged particles is at or below 5 degree.

7. A charged particle source configured to emit charged particles, the charged particle source comprising:
an emitter configured to emit charged particles from a tip end,
wherein the emitter has a shape of a spherical surface attached to a tip end of a needle portion,
wherein an angle over 90 degree is formed between a straight line and an optical axis of the charged particles, the straight line connecting an intersection between the needle portion and the spherical surface with a center of the spherical surface,
wherein a distance between a first position on a surface of the spherical surface and the center is equal to a distance between the intersection and the center,
wherein the emitter is formed of a tungsten single crystal, and
wherein an axis orientation of <100> of the tungsten single crystal is deemed as an optical axis of the charged particles.

8. A charged particle source configured to emit charged particles, the charged particle source comprising:
an emitter configured to emit charged particles from a tip end,
wherein the emitter has a shape of a spherical surface attached to a tip end of a needle portion,
wherein an angle over 90 degree is formed between a straight line and an optical axis of the charged particles, the straight line connecting an intersection between the needle portion and the spherical surface with a center of the spherical surface,
wherein a distance between a first position on a surface of the spherical surface and the center is equal to a distance between the intersection and the center, and
wherein a radius of the spherical surface is at or above 1 micrometer.

9. A charged particle source configured to emit charged particles, the charged particle source comprising:
an emitter configured to emit charged particles from a tip end,
wherein the emitter has a shape of a spherical surface attached to a tip end of a needle portion,
wherein an angle over 90 degree is formed between a straight line and an optical axis of the charged particles, the straight line connecting an intersection between the needle portion and the spherical surface with a center of the spherical surface,
wherein a distance between a first position on a surface of the spherical surface and the center is equal to a distance between the intersection and the center, and
wherein a tip end of the emitter has a first flat surface perpendicular to an optical axis of the charged particles, and also has a plurality of second flat surfaces parallel to an optical axis of the charged particles.

10. A charged particle beam apparatus comprising the charged particle source according to claim 9 and an extraction electrode having an opening,
wherein a voltage is applied to the extraction electrode such that a first charged particle emitted from the first flat surface passes through the opening, and that a second charged particle emitted from the second flat surface collides with the extraction electrode.

11. The charged particle source according to claim 9,
wherein the second flat surface is formed to be perpendicular to a first straight line that is perpendicular to the optical axis, and
wherein the second flat surface is formed to be perpendicular to a second straight line that is perpendicular to the optical axis and to the first straight line.

12. A charged particle source configured to emit charged particles, the charged particle source comprising:
- an emitter configured to emit charged particles from a tip end,
- wherein the emitter has a shape of a spherical surface attached to a tip end of a needle portion,
- wherein an angle over 90 degree is formed between a straight line and an optical axis of the charged particles, the straight line connecting an intersection between the needle portion and the spherical surface with a center of the spherical surface,
- wherein a distance between a first position on a surface of the spherical surface and the center is equal to a distance between the intersection and the center,
- wherein the emitter emits the charged particles from the first position along with a first trajectory having a first range,
- wherein the emitter emits the charged particles from a second position on a surface of the spherical surface along with a second trajectory having a second range, and
- wherein a distance between the first position and a virtual cathode surface of the charged particles emitted from the first position is equal to a distance between the second position and a virtual cathode surface of the charged particles emitted from the second position.

13. A charged particle source configured to emit charged particles, the charged particle source comprising:
- an emitter configured to emit charged particles from a tip end,
- wherein the emitter has a shape of a spherical surface attached to a tip end of a needle portion,
- wherein an angle over 90 degree is formed between a straight line and an optical axis of the charged particles, the straight line connecting an intersection between the needle portion and the spherical surface with a center of the spherical surface,
- wherein a distance between a first position on a surface of the spherical surface and the center is equal to a distance between the intersection and the center, and
- wherein the charged particle source is a thermal field emission electron emitting source.

14. A charged particle source configured to emit charged particles, the charged particle source comprising:
- an emitter configured to emit charged particles from a tip end,
- wherein the emitter has a shape of a spherical surface attached to a tip end of a needle portion,
- wherein an angle over 90 degree is formed between a straight line and an optical axis of the charged particles, the straight line connecting an intersection between the needle portion and the spherical surface with a center of the spherical surface,
- wherein a distance between a first position on a surface of the spherical surface and the center is equal to a distance between the intersection and the center, and
- wherein an equipotential surface formed around a tip end of the emitter is parallel to a surface shape of the spherical surface in a region closer to a tip end of the emitter than a center of the spherical surface.

15. A charged particle source configured to emit charged particles, the charged particle source comprising:
- an emitter configured to emit charged particles from a tip end,
- wherein the emitter has a shape of a spherical surface attached to a tip end of a needle portion,
- wherein an angle over 90 degree is formed between a straight line and an optical axis of the charged particles, the straight line connecting an intersection between the needle portion and the spherical surface with a center of the spherical surface,
- wherein a distance between a first position on a surface of the spherical surface and the center is equal to a distance between the intersection and the center,
- wherein a first electric field at an intersection between an optical axis of the charged particles and the spherical surface has a first electric field intensity,
- wherein a second electric field at a position on the spherical surface other than an intersection between the optical axis of the charged particles and the spherical surface has a second electric field intensity, and
- wherein the first electric field intensity is greater than the second electric field intensity.

16. A charged particle source configured to emit charged particles, the charged particle source comprising:
- an emitter configured to emit charged particles from a tip end,
- wherein the emitter has a shape of a spherical surface attached to a tip end of a needle portion,
- wherein an angle over 90 degree is formed between a straight line and an optical axis of the charged particles, the straight line connecting an intersection between the needle portion and the spherical surface with a center of the spherical surface,
- wherein a distance between a first position on a surface of the spherical surface and the center is equal to a distance between the intersection and the center, and
- wherein the needle portion has a shape parallel to an optical axis of the charged particles.

* * * * *